(12) United States Patent
Dousteyssier et al.

(10) Patent No.: US 11,825,640 B2
(45) Date of Patent: *Nov. 21, 2023

(54) ELECTROMAGNETIC SHIELDING DEVICE

(71) Applicant: DELFINGEN INDUSTRY, Anteuil (FR)

(72) Inventors: Clément Dousteyssier, Faverges (FR); Ryan Christian Gray, Tonawanda, NY (US)

(73) Assignee: DELFINGEN INDUSTRY, Anteuil (FR)

( * ) Notice: Subject to any disclaimer, the term of this patent is extended or adjusted under 35 U.S.C. 154(b) by 0 days.

This patent is subject to a terminal disclaimer.

(21) Appl. No.: 17/619,951

(22) PCT Filed: Jun. 30, 2020

(86) PCT No.: PCT/EP2020/068433
§ 371 (c)(1),
(2) Date: Dec. 16, 2021

(87) PCT Pub. No.: WO2021/001384
PCT Pub. Date: Jan. 7, 2021

(65) Prior Publication Data
US 2022/0361385 A1   Nov. 10, 2022

Related U.S. Application Data

(63) Continuation-in-part of application No. 16/459,944, filed on Jul. 2, 2019, now Pat. No. 10,966,357.

(30) Foreign Application Priority Data

Jul. 2, 2019 (FR) ........................ 1907346

(51) Int. Cl.
*H05K 9/00* (2006.01)
*B21F 45/06* (2006.01)
(Continued)

(52) U.S. Cl.
CPC ........... *H05K 9/0098* (2013.01); *B21F 45/06* (2013.01); *D03D 1/0058* (2013.01); *H01B 9/006* (2013.01); *H05K 9/009* (2013.01); *H05K 9/0084* (2013.01)

(58) Field of Classification Search
CPC ..................................... H05K 9/0098
See application file for complete search history.

(56) References Cited

U.S. PATENT DOCUMENTS

| 10,966,357 B2 | 3/2021 | Dousteyssier |
| 2002/0195260 A1 | 12/2002 | Marks |

(Continued)

FOREIGN PATENT DOCUMENTS

| FR | 2819092 | 7/2002 |
| JP | 2007-060784 | 3/2007 |

(Continued)

OTHER PUBLICATIONS

International Search Report and Written Opinion for PCT/EP2020/068433 dated Sep. 23, 2020.

(Continued)

*Primary Examiner* — Hung V Ngo
(74) *Attorney, Agent, or Firm* — WORKMAN NYDEGGER

(57) ABSTRACT

An electromagnetic shielding device (40) including at least one hollow protective textile sleeve (50) having a main rest diameter D1 and an interior volume configured to receive one or several elongated element(s) (20, 21), at least one hollow connecting textile sleeve (60) having a rest diameter D2, D2 greater than D1. The protective textile sleeve (50) comprises a substantially annular front part (52) having a front open end (54), the connecting textile sleeve (60) includes a substantially annular rear part (62) having a rear open end (64), and the shielding device (40) includes a first (Continued)

electrically conductive, in particular at least partially annular, securing area (70) in which the rear part (62) of the connecting sleeve (60) and the front part (52) of the protective sleeve (50) are at least partly secured.

18 Claims, 6 Drawing Sheets

(51) Int. Cl.
*D03D 1/00* (2006.01)
*H01B 9/00* (2006.01)

(56) References Cited

U.S. PATENT DOCUMENTS

| 2013/0068518 | A1 | 3/2013 | Takashi et al. |
| 2014/0246109 | A1 | 9/2014 | Walton et al. |
| 2015/0289420 | A1 | 10/2015 | Imahori |
| 2018/0219327 | A1 | 8/2018 | Hirooka et al. |
| 2019/0027908 | A1 | 1/2019 | Tomoya et al. |
| 2019/0191601 | A1* | 6/2019 | Suenaga ............ H01B 13/0036 |
| 2019/0223333 | A1* | 7/2019 | Yokoyama ........... H01B 7/0045 |

FOREIGN PATENT DOCUMENTS

| JP | 2017-204515 | 11/2017 |
| WO | 2011-152416 | 12/2011 |

OTHER PUBLICATIONS

U.S. Appl. No. 16/459,944, filed Dec. 10, 2019, Office Action.
U.S. Appl. No. 16/459,944, filed Jul. 16, 2020, Final Office Action.
U.S. Appl. No. 16/459,944, filed Dec. 3, 2020, Notice of Allowance.

* cited by examiner

ELECTROMAGNETIC SHIELDING DEVICE

CROSS-REFERENCE TO RELATED APPLICATIONS

The present application is a 371 US Nationalization of PCT Patent Application No. PCT/EP2020/068433, filed Jun. 30, 2020, which claims priority to French Patent Application No. 1907346 and U.S. patent application Ser. No. 16/459,944, both filed Jul. 2, 2019, the disclosure of each of which is hereby incorporated by reference in its entirety.

TECHNICAL FIELD

The present invention relates to an electromagnetic shielding device of the type electromagnetic shielding textile sleeve.

The present invention also relates to a method for manufacturing an electromagnetic shielding device as well as a device for transmitting electrical energy comprising an electromagnetic shielding device.

PRIOR ART

It is known to use electromagnetic shielding sleeves to protect, mechanically and from electromagnetic disturbances, the electric cables disposed in the interior volume of these sleeves and in connection with at least one of their ends with an electrical connector, as well as to protect the external environment of these shielding sleeves from electromagnetic disturbances capable of being generated by the electric cables enclosed in these shielding sleeves. These sleeves are formed of electrically conductive metal yarns and cover, by means of at least one of their ends, an electrical connector provided with a grounding region. The dimensions of these sleeves must therefore be adapted to the electric cables and to the connector(s), which have very different dimensions. These sleeves can thus be deformable, in particular able to expand radially, to cover at least partly the connector and in particular said grounding area, namely to have a sufficient rest diameter, that is to say greater than or equal to the largest external dimension of the connector. Said sleeves must also be configured to allow an electrical connection with the grounding area, generally carried out by a welding between the sleeve and the grounding area or by a clamping means tightened around the sleeve covering at least partly the grounding area of the connector.

However, all fully-metal shielding sleeves have the disadvantages of not expanding radially, or very little and not easily, so that shielding sleeves have been proposed, mixing metal yarns and plastic material yarns in order to provide them with radial expansion properties.

Nevertheless, when a sleeve is in the expanded state in operation, that is to say when it protects the electric cables and covers partly one or several connector(s), it does not perfectly ensure its functions of shielding and protection from external mechanical attacks due to its expanded network that has large openings and therefore less areas of contact with the elements to be protected.

In addition, fully-metal sleeves are expensive, and have a high weight.

Moreover, the electric cable(s) to be protected and the possible connectors on which these cables are connected do not have the same external dimensions, the space requirement of the connectors being generally greater than that of the cables. Thus, it is possible to use a shielding sleeve selected so as to have a diameter sufficient to cover the connector, which diameter will be much larger than the one that is required to receive the electric cables connected to the connector. The amount of shielding sleeve protecting the cables is therefore excessive, thus resulting in a greater mass compared to the one that would be required to protect, mechanically the electric cables from electromagnetic disturbances. However, these shielding sleeves can be used in the field of transportation, for example in the automotive sector, especially for electric or hybrid cars, for which precisely the optimization of their weights is essential because impacting their energy consumption. It is also possible to use a radially deformable shielding sleeve so that the rest diameter thereof is adapted to the outer diameter occupied by the electric cables, and so that it is in the expanded state when it covers the connector. However, as mentioned above, the part of the expanded sleeve does not properly ensure its shielding role. In addition, it can be complex to have a shielding sleeve having the appropriate diameter for covering cables, and able to expand sufficiently to cover a connector.

Document US 2013/0068518 A1 thus relates to an electromagnetic shielding sleeve, an open end of which is folded on itself and able to expand radially. For the expanded end part to preserve shielding properties equivalent to those provided by the rest of the sleeve, the end part is folded on itself, the folded inner part being freely disposed, and not expanded, against the expanded outer part. The shielding sleeve must, however, be chosen so that it can expand sufficiently to be able to cover the connector. The arrangement of the folded part, with a freely disposed inner part, is time consuming to handle. In addition, even if the folding arrangement makes it possible to improve the preservation of the shielding properties, a too large expansion risks to open too much the textile structure of the expanded outer part to the detriment of the shielding performances.

DISCLOSURE OF THE INVENTION

An object of the present invention is to propose a shielding device whose shielding properties and mechanical protection function are similar at rest (i.e. in the non-fitted state) and in operation, while optimizing the mass of the shielding device.

An object of the present invention is to propose a shielding device that is simple to implement and that conforms to the dimensions of the electric cables and of the connector(s) with which they are in connection.

The present invention overcomes all or part of the aforementioned problems in that it relates, according to a first aspect, to an electromagnetic shielding device comprising:
  a. At least one hollow protective textile sleeve having a main rest diameter D1 and an interior volume configured to receive one or several elongated element(s),
  b. At least one hollow connecting textile sleeve having a rest diameter D2, D2 greater than D1, the protective textile sleeve comprises a substantially annular front part having a front open end, the connecting textile sleeve comprises a substantially annular rear part having a rear open end, and said shielding device comprises a first electrically conductive, in particular at least partially annular, securing area in which the rear part of the connecting sleeve and the front part of the protective sleeve are at least partly secured.

Advantageously, the shielding device comprises two textile sleeves having separate rest diameters but assembled at one of their annular ends, so that the diameter of the connecting sleeve is adapted to the size of the connector independently of the diameter of the protective sleeve, adapted, for its part, to the elongate elements to be protected. The size of the shielding device is therefore adapted to the connector(s) and to the elongate elements in a differentiated manner along its length, which makes it possible to adjust the weight of the device. In addition, advantageously, the body of the protective sleeve in the extension of its annular front part, has a rest diameter D1 substantially corresponding to diameter in operation. Thus, when this protective sleeve receives elongate elements to be protected, the body is not in the expanded state and maintains its properties of shielding and mechanical protection. The same technical effect can be observed for the connecting sleeve. The diameter of the body of the connecting sleeve in the extension of its annular rear part may be substantially in the order of D2 in operation, or expand to conform to the shape of the connector as described below.

Advantageously, the securing between the rear part of the connecting sleeve and the front part of the protective sleeve is configured so that it is electrically conductive. Electricity is thus conducted from the protective sleeve to the connecting sleeve including through the first securing area, and vice versa.

In an embodiment, the shielding device comprises a second hollow connecting textile sleeve having a rest diameter D3, D3 being greater than D1, especially D3 is in the order of D2 or different from D2. The second connecting sleeve comprises a substantially annular rear part having a rear open end, the protective sleeve comprises a substantially annular rear part having a rear open end. The shielding device comprises a second electrically conductive, in particular at least partially annular, securing area in which the rear part of the second connecting sleeve and the rear part of the protective sleeve are at least partly secured.

The rest diameter D1 is measured outside the front part of the protective sleeve, on the body of the protective sleeve projecting from the substantially annular front part, especially between the substantially annular front and rear parts.

The rest diameter D2 (or D3) is measured outside the substantially annular rear part disposed in the first securing area, (or in the second securing area), on the body of the connecting sleeve. D2 (or D3) is/are thus measured especially between the substantially annular front and rear parts of the (first or second) connecting sleeve.

The (first or second) connecting sleeve comprises an interior volume opening into the interior volume of the protective sleeve.

Preferably, the (first and/or second) connecting sleeve(s) and/or said at least one protective sleeve is/are configured to expand radially and reversibly so that it/their rest diameter(s) is/are increased.

Said elongated element(s) is/are preferably one or several electric cable(s), and possibly optical fibers.

The connector(s) to which the elongate element(s) is/are connected, may have a round, oval, square, rectangular cross section, or any other shape necessary for the desired connection.

The (outer) diameter (D1) of the protective sleeve is preferably greater than or equal to 3 mm, and less than or equal to 120 mm, more preferably greater than or equal to 5 mm and less than or equal to 100 mm.

The (outer) diameter(s) (D2, D3) of the connecting sleeve(s) is/are preferably greater than or equal to 3 mm, and less than or equal to 120 mm, more preferably greater than or equal to 20 mm and less than or equal to 100 mm.

The length of the protective sleeve is function of the length of the electric cable(s) to be protected.

The length of the protective sleeve is preferably greater than or equal to 10 cm, and less than or equal to 10 meters.

The length of the connecting sleeve is function of the length of the connector to be partially covered. The length of the connecting sleeve is preferably greater than or equal to 3 cm, and less than or equal to 50 cm, for example less than or equal to 40 cm or 15 cm, especially less than or equal to 10 cm.

In an embodiment, the diameter D2 of the connecting sleeve is greater than or equal to 1.10 times, preferably 1.20 times, more preferably 1.30 times, the diameter D1 of the protective sleeve (D2≥1.10*D1, preferably D2≥1.20*D1, more preferably D2≥1.30*D1).

Said at least one connecting textile sleeve and the protective textile sleeve are each obtained by mechanical manipulation of at least one yarn.

Said at least one connecting textile sleeve and the protective textile sleeve each comprise at least one electrically non-conductive yarn and at least one electrically conductive yarn.

The hollow textile sleeves have each a substantially tube shape so that it is possible, at rest and therefore without stress, to measure their outer diameter.

The textile sleeves are flexible so that they can be folded and their cross sections can be substantially deformed in a reversible manner, with or without expansion, so as to conform to the shape of the elongate elements and the connectors.

Preferably, the connecting sleeve has a longitudinal axis L2 and the protective sleeve has a longitudinal axis L1, the connecting sleeve and the protective sleeve are coaxial. The axes L1 and L2 are thus preferably coincident.

Said yarn(s) in the present invention (electrically conductive or not) may be a monofilament yarn, a fiber spun yarn or a multifilament yarn.

The shielding device can be used in the following industries: aeronautical, automotive, aerospace, railway, marine industries, the telecommunications, the household appliances, the electrical generators and transformers, the lighting, and especially in automotive, aeronautical and railway industries.

The electromagnetic shielding device according to the invention has the function of protecting the electric cables from external mechanical attacks, but also from electromagnetic interferences.

An electromagnetic interference is considered in the present text to be any disturbance generated by a source, for example electrical source, disposed outside the shielding device, or inside the shielding device (by the electric cables), capable of generating an electric circuit by electromagnetic induction, electrostatic coupling, or conduction, or even a combination thereof.

Therefore, the shielding device also protects the external environment of said shielding device from electromagnetic interferences which may be emitted by the electric cables it encloses.

The frequency of an interference is preferably greater than 0 KHz and less than or equal to 2 GHz.

In an embodiment, the shielding device meets the IEC 62153-4-3: 2013 (IEC for International Electrotechnical Commission) standard entitled "Metallic communication cable test methods—Parts 4-3: Electromagnetic compatibility (EMC)—Surface transfer impedance—Triaxial method". This method determines the effectiveness of the protection of a shielding device by applying predefined current and voltage to determine the surface transfer impedance. This method is in particular used for the electromagnetic disturbances of low frequencies, that is to say comprised between 0 KHz and 100 MHz. Preferably, the attenuation for low frequencies obtained according to the IEC 62153-9-3: 2013 standard is greater than or equal to 30 dB, more preferably greater than or equal to 60 dB.

In an embodiment, the shielding device meets the IEC 61000-4-21: 2011 (IEC for International Electrotechnical Commission) standard entitled "Electromagnetic compatibility (EMC)—Parts 4-21: Testing and measurement techniques—Reverberation chamber test methods". This method determines the efficiency of the protection of a shielding device in reverberation chambers. This method is especially used for the electromagnetic disturbances of high frequencies, that is to say higher than 100 MHz.

Preferably, the attenuation for high frequencies obtained according to the IEC 61000-4-21: 2011 standard is greater than or equal to 30 dB, more preferably greater than or equal to 50 dB.

In an embodiment, the resistivity of the protective textile sleeve and/or the resistivity of the connecting textile sleeve is/are greater than or equal to 0.1 mΩ (milliohm)/meter, and less than or equal to 10 mΩ/meter, especially less than or equal to 5 mΩ/meter.

In an embodiment, the force at break of the shielding device is greater than or equal to 1,000 Newtons, in particular greater than or equal to 3,000 Newtons, more particularly greater than or equal to 5,000 Newtons, especially less than or equal to 100,000 Newtons.

In an embodiment, the first securing area has a width greater than or equal to 5 mm, in particular greater than or equal to 10 mm, more particularly less than or equal to 50 mm, especially less than or equal to 30 mm.

In an embodiment, the protective textile sleeve and/or the connecting textile sleeve does not comprise a longitudinal opening.

In the present text, it is understood by rest diameter of a textile sleeve, its outer diameter in the unexpanded state, without any deformation being applied thereto.

In the present text, it is understood by diameter in the expanded state of a textile sleeve, its outer diameter in the expanded state upon the application of a radial deformation.

In a variant, the connecting sleeve comprises a front part having a substantially annular front open end of a rest diameter $D2$, said front part being configured to expand radially in order to adopt a diameter $D2'$ in the expanded state greater than or equal to 1.20 times, preferably greater than or equal to 1.30 times, more preferably greater than or equal to 1.40 times, especially less than or equal to 1.80 times, the diameter $D2$.

The annular front part of the connecting sleeve thus easily conforms to different shapes of connectors, which are especially square or rectangular.

Preferably the protective sleeve is configured to expand radially in order to adopt a diameter $D1'$ in the expanded state greater than or equal to the rest diameter $D2$.

In a variant, the front part of the protective sleeve is in a radially expanded state and with a diameter $D1'$ approximately equal to the diameter $D2$ of the connecting sleeve.

Preferably, the substantially annular front part of the protective sleeve is in an expanded state in the first securing area, and especially with an outer diameter greater than $D1$, in particular in the order of $D1'$.

The diameter $D1'$ is approximately equal to the (outer) diameter $D2$, within +/− one or two thickness(es) of the connecting sleeve.

Advantageously, the protective sleeve is configured to expand radially, this facilitates its securing to the connecting sleeve.

In an embodiment, when the shielding device comprises a second connecting textile sleeve, the substantially annular rear part of the protective sleeve is in a radially expanded state in the second securing area, and especially with a diameter $D1''$ in the expanded state greater than or equal to the rest diameter $D3$.

This faculty of expansion of the protective sleeve makes it possible to obtain a first area of securing, for example superimposing, and thus contacting, the annular front part of the protective sleeve to the annular rear part of the connecting sleeve, thereby improving the conduction of electricity between the two sleeves and therefore the preservation of the electromagnetic shielding effect over the entire length of the shielding device. The same effect applies for the second securing area when it is present.

The protective sleeve is configured to expand so that the diameter(s) $D1'$ and/or $D1''$ is/are greater than or equal to/equal to 1.20 times, preferably greater than or equal to/equal to 1.30 times, more preferably greater than or equal to 1.40 times, especially greater than or equal to 1.80 times, the diameter(s) $D2$ and/or $D3$.

In a variant, the rear part of the connecting sleeve is folded on itself in the first securing area, especially of a substantially U-shape along a longitudinal-section plane P passing through the longitudinal axis $L2$ of the connecting sleeve.

This arrangement makes it possible to have a rounded clear junction between the connecting and protective textile sleeves, thus avoiding any risk of snagging on the path of the shielding device. The tear strength of the junction thus formed is also improved compared to a junction according to which the annular front part of the protective sleeve would be placed inside the unfolded annular rear part of the connecting sleeve.

Especially, the front part of the protective sleeve comprises a single textile layer in the first securing area and the rear part of the connecting sleeve comprises two superimposed textile layers, especially in the first securing area.

Preferably, the rear part of the connecting sleeve is folded inside its interior volume.

It is understood by folded on itself that the rear part of the connecting sleeve comprises a folded portion facing the connecting sleeve, directly against the connecting sleeve or around (that is to say by sandwiching) one or several elements, for example around at least a portion of the protective sleeve.

In a variant, the rear part of the connecting sleeve comprises an inner portion at least partly secured to the protective sleeve, especially to the front part thereof, and an outer portion, superimposed on the inner portion and in the extension of the inner portion.

The inner and outer portions of the rear part of the connecting sleeve each comprise opposite inner and outer faces, the outer faces being oriented towards the outside of the interior volume of the connecting sleeve.

The front part of the protective sleeve comprises opposite inner and outer faces, the inner face being oriented facing the interior volume of the protective sleeve.

Preferably, the inner face of the inner portion of the rear part of the connecting sleeve is in contact with the outer face of the front part of the protective sleeve.

In an embodiment, the outer face of the inner portion of the rear part of the connecting sleeve is in contact with the inner face of the outer portion of the connecting sleeve.

In another embodiment, the outer face of the inner portion of the rear part of the connecting sleeve is in contact with, especially secured to, the front part of the protective sleeve, especially with the outer face of the protective sleeve.

In a variant, the front part of the protective sleeve is folded on itself, especially in the first securing area, especially of a substantially U-shaped along a plane P of longitudinal section passing through the longitudinal axis L1 of the protective sleeve.

Preferably, the front part of the protective sleeve is folded outside the protective sleeve, for example so as to form a U turned towards the outside.

This arrangement allows the front part of the protective sleeve to offer a rounded face opening into its interior volume, and thus avoids damaging the electric cables disposed in its interior volume.

It is understood by folded on itself that the front part of the protective sleeve comprises a folded portion facing the protective sleeve, directly against the protective sleeve or around one or several elements, for example around at least one portion of the connecting sleeve.

In a variant, the front part of the protective sleeve comprises an outer portion at least partly secured to the connecting sleeve, and an inner portion covered at least partly by the outer portion of the front part of the protective sleeve and in the extension of the outer portion.

In a sub-variant, the outer portion of the front part of the protective sleeve is at least partly secured to the rear part of the connecting sleeve, in particular to the inner portion of the rear part of the connecting sleeve.

In a sub-variant, the inner portion of the front part of the protective sleeve is oriented facing the interior volume of the protective sleeve.

In a variant, the front part of the protective sleeve is folded on itself around, at least partially, a portion of the rear part of the connecting sleeve, in particular the inner portion of the connecting sleeve.

The inner portion of the rear part of the connecting sleeve is disposed between the outer and inner portions of the front part of the protective sleeve.

In a variant, the folded front part of the protective sleeve is superimposed with the folded rear part of the connecting sleeve.

Preferably, the outer portion of the front part of the protective sleeve and the inner portion of the rear part of the connecting sleeve are disposed between the inner portion of the front part of the protective sleeve, and the outer portion of the rear part of the connecting sleeve.

The folded front part of the protective sleeve is thus not partially nested with the folded rear part of the connecting sleeve.

In a variant, the front part of the protective sleeve comprises a front annular edge and the rear part of the connecting sleeve comprises a rear annular edge, the front annular edge of the protective sleeve and the rear annular edge of the connecting sleeve being disposed edge-to-edge in the first securing area without superposition of the protective sleeve by the connecting sleeve.

In another variant, the front part of the protective sleeve is superimposed with the rear part of the connecting sleeve in the first securing area.

Preferably, the front part of the protective sleeve and the rear part of the connecting sleeve each comprise a single textile layer.

Preferably, the front part of the protective sleeve is disposed inside the connecting sleeve, in contact with the inner face of the rear part of the connecting sleeve.

In a variant, the first electrically conductive securing area comprises three or four textile layers secured in their thicknesses in an electrically conductive manner, including at least two textile layers of the protective textile sleeve, and at least one textile layer of the connecting sleeve.

Preferably, the outer portion of the rear part of the connecting sleeve is not secured in its thickness, especially in an electrically conductive manner, to the front part of the protective sleeve, that is to say to the inner and/or outer portion of the front part of the protective sleeve, and/or to the inner portion of the rear part of the connecting sleeve. In particular, the outer portion of the connecting sleeve does not comprise any welding.

In one embodiment, the three secured textile layers comprise the outer and inner portions of the front part of the protective sleeve and the inner portion of the rear part of the connecting sleeve.

In one embodiment, the four secured textile layers comprise the outer and inner portions of the front part of the protective sleeve and the inner and outer portions of the rear part of the connecting sleeve.

In a variant, the first electrically conductive securing area is covered with at least one portion of the rear part of the connecting sleeve, especially by the outer portion of the rear part of the connecting sleeve.

Advantageously, the outer portion of the rear part of the connecting sleeve is not secured, especially welded, in its thickness to the front part of the protective sleeve so that it can move relative to the front part of the protective sleeve.

This arrangement is found when the connecting sleeve has been turned over during the method for manufacturing the shielding device.

This arrangement prevents a welding from opening outside the shielding device and abrading the surrounding elements by contact.

In a variant, the protective sleeve is in one or several textile(s) selected among: a braid, a woven fabric, a knit, a non-woven fabric, or a combination thereof.

In a variant, the connecting sleeve is in one or several textile(s) selected among: a braid, a woven fabric, a knit, a non-woven fabric, or a combination thereof.

In a variant, the protective sleeve and/or the connecting sleeve is/are each a tubular braid or a tubular knit.

In an embodiment, the protective sleeve and/or the connecting sleeve is/are each obtained by braiding a number of strands comprised in the interval [16; 144] especially in the interval [32; 144] each strand comprising at least one electrically conductive yarn and/or at least one electrically non-conductive yarn, preferably each strand comprising at least two electrically non-conductive yarns.

In an embodiment, the number of crossings per inch of the strands of the braided protective sleeve and/or of the braided connecting sleeve is greater than 0 and less than or equal to 20, preferably greater than or equal to 5 and less than or equal to 15. A strand may comprise one or several yarn(s) and is supported by a spindle (corresponding to a spool) on the braiding machine.

In a variant, the protective sleeve and/or the connecting sleeve comprises/comprise each at least one electrically conductive yarn, especially a monofilament yarn and/or a multifilament yarn and/or a fiber spun yarn, and/or electrically conductive fibers.

The electrically conductive yarn is preferably a monofilament yarn or a multifilament yarn.

In an embodiment, the monofilament of the electrically conductive monofilament yarn or part or all of the filaments of the electrically conductive multifilament yarn may be each of the core-coating type, with a coating, such as sheath, in at least one electrically conductive material so that the outer coating conducts electricity. The core is also preferably in at least one electrically conductive material. In this case, the yarn may be a tinned yarn, for example made of tinned copper, especially comprising a copper core and a tin or nickel coating.

In another embodiment, the monofilament of the monofilament yarn or part or all of the filaments of the multifilament yarn may be each in at least one electrically conductive material.

Preferably, when the conductive yarn is a multifilament yarn, it comprises from 2 to 50 filaments, more preferably from 2 to 40 filaments, especially from 4 to 25 filaments, particularly from 5 to 20 filaments.

Preferably, the diameter of each of at least part or all of the filaments of the multifilament yarn is greater than 0 mm and less than or equal to 1 mm, more preferably less than or equal to 0.50 mm, preferentially less than or equal to 0.30 mm, especially in the order of 0.10 mm.

Said at least one electrically conductive material is selected from metals, preferably selected from: copper, stainless steel, iron, silver, aluminum and nickel.

In a variant, the protective sleeve and/or the connecting sleeve comprises/comprise each at least one electrically non-conductive yarn, especially a monofilament yarn and/or a multifilament yarn and/or a fiber spun yarn, and/or electrically non-conductive fibers.

Said electrically non-conductive yarn and/or fibers comprise(s) at least one electrically non-conductive material, especially at least one synthetic material, in particular at least one polymer material, especially at least partly thermofusible material. This last arrangement facilitates the manufacture of the first electrically conductive securing area by welding (ultrasound, friction, etc.).

Said at least one electrically non-conductive material is preferably selected from the list consisting of: polyesters, in particular polyethylene terephthalate, polybutylene terephthalate; aramids, in particular para-aramid and meta-aramid; polyamides, in particular PA 6-6, PA 4-6, PA 6; polypropylene, polyethylene, in particular high molecular weight polyethylene, polysulfone, carbon (carbon fibers), basalt (basalt fibers), glass (glass fibers) or a mixture thereof.

Preferably, the monofilament yarn has a diameter greater than 0 mm, and less than or equal to 1 mm, more preferably less than or equal to 0.50 mm, especially less than or equal to 0.30 mm.

Preferably, the multifilament yarn or the fiber spun yarn has a titre greater than 0 dtex and less than or equal to 3,000 dtex, more preferably less than or equal to 1,500 dtex, especially less than or equal to 800 dtex, especially greater than or equal to 200 dtex and less than or equal to 800 dtex, for example in the order of 550 dtex to +/−100 dtex.

In a variant, the braided or knitted protective sleeve and/or the braided or knitted connecting sleeve has/have an optical coverage greater than or equal to 60% (especially comprised between 60% and 100%).

The optical coverage is measured on the textile sleeve at rest, according to the body thereof, outside the electrically conductive securing areas. This coverage rate can be measured using the ANSI/SCTE 51 2007 standard.

In a variant, the protective sleeve and the connecting sleeve are secured at least partially in the first securing area by means of at least one bonding means selected from the list consisting of: an ultrasonic welding, an electron beam welding, a friction welding, a welding by brazing, a stitching with at least one electrically conductive yarn, or a combination thereof (list I), preferably a bonding means selected from the list consisting of: an ultrasonic welding, a friction welding, a welding by brazing, a stitching with at least one electrically conductive yarn, or a combination thereof (list II).

The ultrasonic welding is preferred because it makes it possible to obtain good conductivity in the first securing area, as well as good mechanical strength (especially force at break) compared to other types of welding.

Alternatively, the bonding means comprises a mechanical securing member, in particular electrically conductive, for example a clamping ring or securing member comprising first and second fasteners configured to cooperate together for their closing (reversibly or not).

Said mechanical securing member can be combined with a bonding means chosen from the list above (list I or II).

The present invention relates, according to a second aspect, to a method for manufacturing an electromagnetic shielding device according to any one of the preceding variants or embodiments with reference to a first aspect of the invention, comprising:

(i)—a step of disposing a hollow protective textile sleeve having an outer rest diameter D1 and an interior volume configured to receive one or several elongated element(s), and comprising a substantially annular front part having a front open end, on at least one expansion device; in particular one region of a shape, said region having an outer perimeter (especially a diameter) greater than or equal to D2; causing the expansion at least of the substantially annular front part of the protective sleeve according to an outer perimeter (especially a diameter) D1' substantially equal to D2;

(ii)—a step of providing a hollow connecting textile sleeve having a main rest diameter D2, D2 being greater than D1, and a substantially annular rear part having a rear open end, and a step of contacting the rear part of the connecting sleeve with the front part of the protective sleeve;

(iii)—a step of forming a first electrically conductive, in particular at least partially annular, securing area, in which the rear part of the connecting sleeve and the front part of the protective sleeve are at least partly secured;

(v)—obtaining the shielding device.

Preferably, said at least one protective sleeve and/or said at least one connecting sleeve is/are manufactured on a braiding machine or a knitting machine. The connecting sleeve and the protective sleeve are tubular braids or different tubular knits, which makes it possible to differentiate their properties and their diameters.

The shape is a tool for shaping, especially expanding, at least the front part of the protective sleeve. Said at least one region of the shape may have any shape, especially conical or rectangular shape, provided that the perimeter or circumference of the shape corresponds to the desired expansion for the front part of the protective sleeve.

In a variant, step (ii) comprises the superposition, or the juxtaposition, at least partial, of the front part of the protective sleeve with the rear part of the connecting sleeve.

In a variant, the protective sleeve comprises a protective textile body projecting from its annular front part, and the connecting sleeve comprises a connecting textile body projecting from its annular rear part. During step ii), the rear part of the connecting sleeve is superimposed on the front part of the protective sleeve on at least the expansion device, especially said region of the shape, the front part of the protective sleeve being disposed between at least said expansion device, especially at least said one region of the shape and the rear part of the connecting sleeve. During step iii), said protective and connecting textile bodies are at least partly superimposed. The method comprises a step iv), prior to step v), comprising the turning over of the body of the connecting sleeve.

In particular, the turning over of the body of the connecting sleeve is carried out so that the connecting sleeve and the protective sleeve are superimposed, specially only, according to the rear part of the connecting sleeve, and according to the front part of the protective sleeve.

In an embodiment, when the rear part of the connecting sleeve is superimposed at least partially with the front part of the protective sleeve during step ii):

a) the front part of the protective sleeve (especially not folded on itself) is disposed between the expansion device, especially said at least one region of the shape, and the rear part of the connecting sleeve (especially not folded on itself); or b) the front part of the protective sleeve is folded around at least one portion of the connecting sleeve, in particular around the inner portion of the rear part of the connecting sleeve; or c) the rear part of the folded protective sleeve is covered, at least partially, by the rear part (especially not folded back on itself) of the connecting sleeve.

Preferably, for the arrangement a), the first electrically conductive securing area comprises (consists of) two secured textile layers in an electrically conductive manner in their thicknesses.

Preferably, for the arrangements b) and c), the first electrically conductive securing area comprises (consists of) three secured textile layers in an electrically conductive manner in their thicknesses.

Preferably, the first securing area is covered with a portion of the connecting sleeve, in particular with the outer portion of the rear part of the connecting sleeve, turned over against the outer and inner portions of the front part of the protective sleeve and against the inner portion of the rear part of the connecting sleeve.

In a variant, the step of forming the first electrically conductive securing area is performed using at least one bonding means selected from the list consisting of: an ultrasonic welding, an electron beam welding, a friction welding, a welding by brazing, a stitching with at least one electrically conductive yarn, or a combination thereof, (list I), preferably a bonding means selected from the list consisting of: an ultrasonic welding, a friction welding, a welding by brazing, a stitching with at least one electrically conductive yarn, or a combination thereof (list II).

The ultrasonic welding is preferred because it makes it possible to obtain good conductivity in the first securing area, as well as good mechanical strength (especially force at break) compared to other types of welding.

Alternatively, the bonding means comprises a mechanical securing member, in particular electrically conductive, for example a clamping ring or securing member comprising first and second fasteners configured to cooperate together for their closing (reversibly or not).

Said mechanical securing member can be combined with a bonding means chosen from the list above (list I or II).

The present invention relates, according to a third aspect, to an electrically transmitting device comprising at least one connector having a grounding area, and one or several electrically conductive elongated element(s), especially each configured to transmit an electrical signal and/or an electrical power, comprising an electromagnetic shielding device according to any one of the variants or embodiments with reference to the first aspect of the invention.

In a variant, the front part of the connecting sleeve is secured at least partly to the grounding area.

The front part of the connecting sleeve can be secured to the grounding area of the connector by means of a welding or, preferably, by means of a clamping member, such as a clamping link, pressing the electrically conductive inner face of the front part of the connecting sleeve against the surface of the grounding area.

The variants, embodiments, definitions according to the first, second and third aspects of the invention may be combined together independently of each other.

DESCRIPTION OF THE DRAWINGS

The invention will be better understood upon reading the following description of the embodiments of the invention given by way of non-limiting example, with reference to the appended drawings, in which.

DESCRIPTION OF THE EMBODIMENTS

Shielding Device

Figure 1:
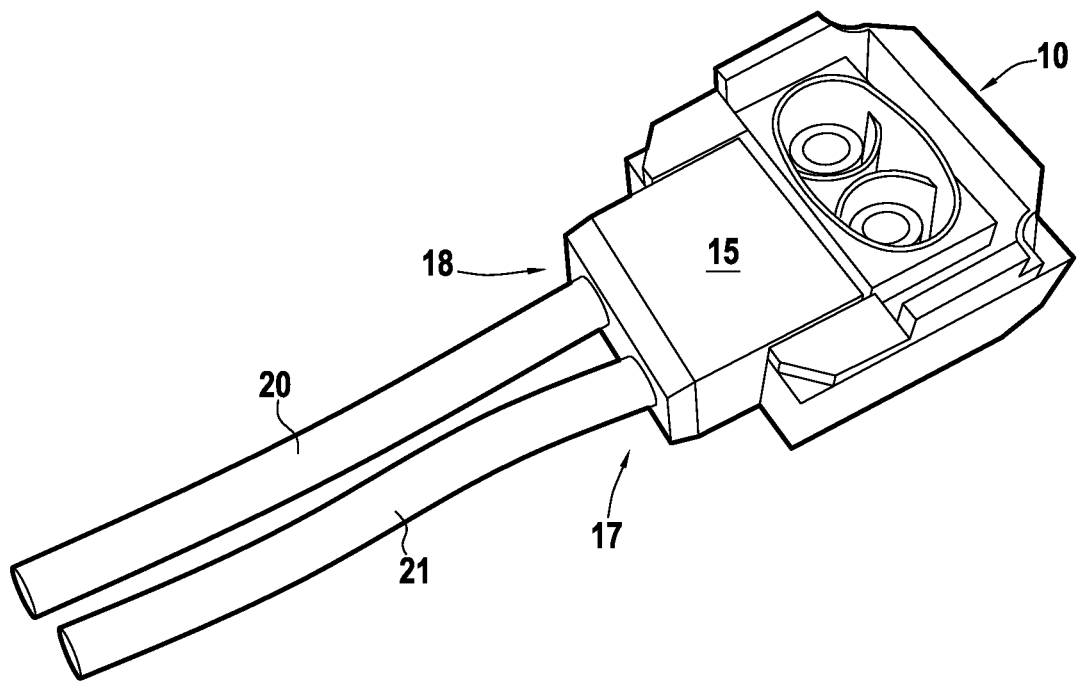
FIG. 1 illustrates a first example of connector in connection with two electric cables.

The connector 10 represented in FIG. 1 comprises a grounding area 15 and two electrical outputs 17, 18 to which two elongated elements 20, 21, especially electric cables, are connected.

Figure 2:
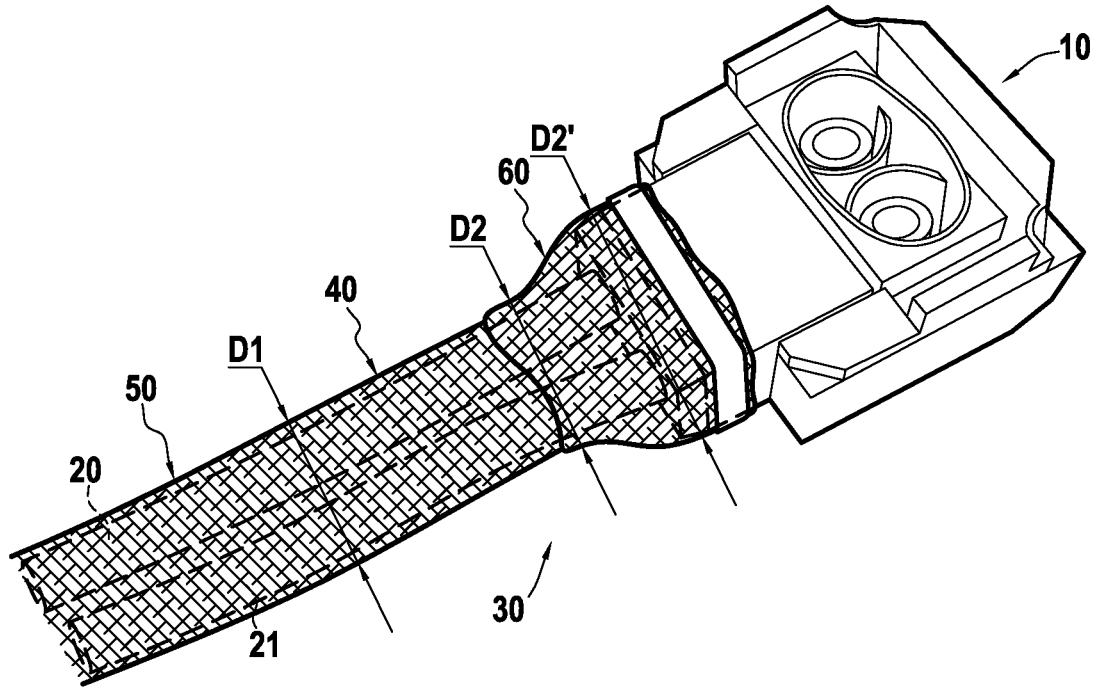
FIG. 2 illustrates a first example of an electromagnetic shielding device disposed on the connector and the electric cables represented in FIG. 1 forming a transmission device according to the invention.
Figure 7:
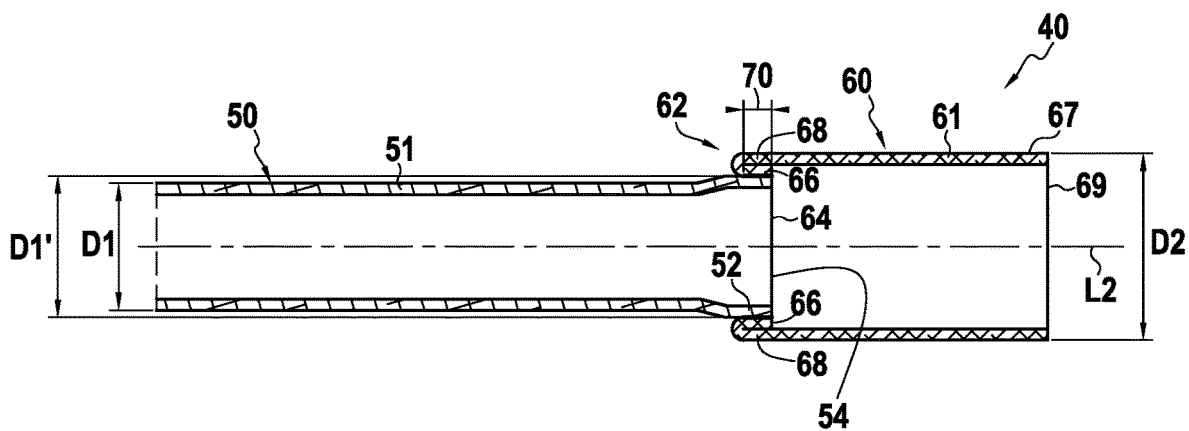
FIG. 7 illustrates the first example of a shielding device according to the plane P of longitudinal section VII-VII represented in FIG. 6.

FIG. 2 represents a transmission device 30 comprising the connector 10 and the electric cables (20, 21) represented in FIG. 1, as well as a first example of an electromagnetic shielding device 40 according to the invention. This shielding device 40 comprises a hollow protective textile sleeve 50 having a main rest diameter D1 and an interior volume configured to receive the electric cables 20 and 21. The shielding device 40 also comprises a hollow connecting textile sleeve 60 having a rest diameter D2. As represented in FIG. 7, the protective textile sleeve 50 comprises a substantially annular front part 52 having a front open end 54, and the connecting textile sleeve 60 comprises a substantially annular rear part 62 having a rear open end 64. The shielding device 40 comprises a first electrically conductive, in particular at least partially annular, securing area 70 in which the rear part 62 of the connecting sleeve 60 and the front part 52 of the protective sleeve 50 are at least partly secured.

The connecting sleeve 60 comprises a front part 67 having a substantially annular front open end 69 of a rest diameter D2, said front part 67 being configured to radially expand in order to adopt a diameter D2' in the expanded state larger than or equal to 1.40 times the diameter D2 as represented in FIG. 2 so as to cover at least partially the grounding area 15.

The protective sleeve 50 is configured to expand radially in order to adopt a diameter D1' in the expanded state greater than or equal to approximately the rest diameter D2, especially in the first securing area 70. In FIG. 7, the diameter D1' appears slightly less than the diameter D2 in order to facilitate the understanding of the construction of the shielding device 40. In practice, D1' is in the order of D2 within two thicknesses of connecting sleeve textile layers. In general in the figures, the thicknesses of welded textile layers are represented not crushed, while in practice, being secured, in particular welded, they are substantially flattened.

Figure 6:
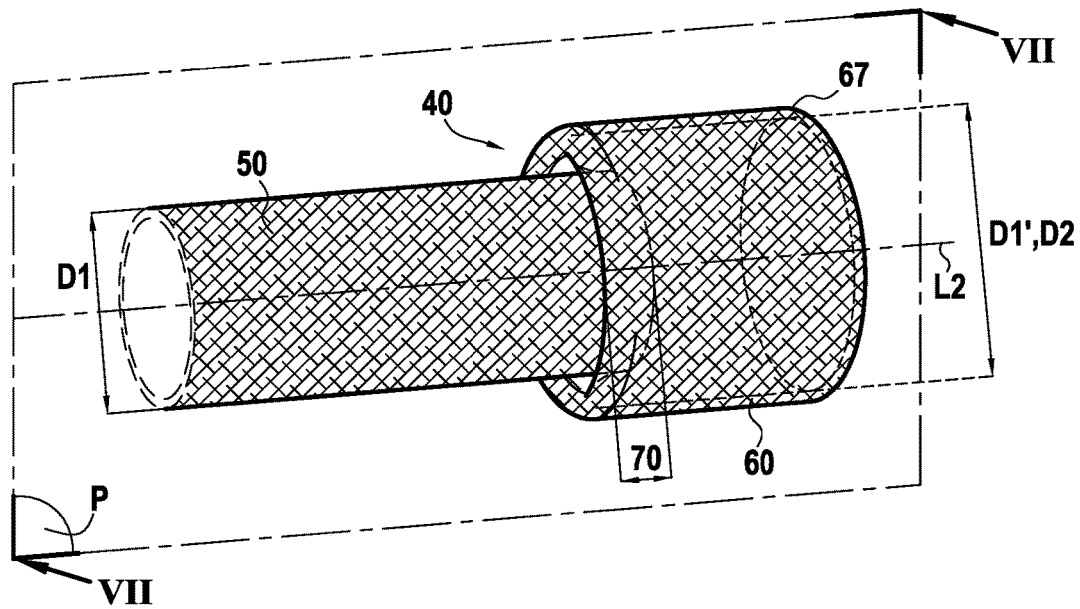
FIG. 6 illustrates the first exemplary shielding device of FIG. 2.

The rear part 62 of the connecting sleeve 60 is folded on itself, in particular in the first securing area 70, especially of a substantially U-shape along a plane P of longitudinal section VII-VII represented in FIG. 6 and passing through the longitudinal axis L2 of the connecting sleeve 60.

The rear part 62 comprises an inner portion 66 at least partly secured to the protective sleeve 50, in particular to the front part 52 thereof, and an outer portion 68, superimposed on the inner portion 66 and in the extension of the inner portion 66. The first securing area 70 comprises the front part 52 of the protective sleeve 50 and the inner portion 66 of the rear part 62 of the connecting sleeve 60 secured in an electrically conductive manner in their thicknesses. The first securing area 70 is covered by the outer portion 68 of the rear part 62 of the connecting sleeve 60, which is therefore able to move relative to the inner portion 66 and to the front part 52.

The protective sleeve 50 and the connecting sleeve 60 are each in a hollow tubular braid comprising electrically conductive multifilament yarns and monofilament or multifilament yarns in PET (polyethylene terephatalate). The protective sleeve 50, and therefore the body 51, have a diameter D1 in the order of 30 mm. The protective sleeve is configured to expand by at least 30%, and is obtained on a braiding machine, each spindle of which supports two electrically conductive yarns and two electrically non-conductive yarns. The number of crossings per inch is preferably in the order of 12.

The connecting sleeve 60, and therefore the body 61, have a diameter D2 in the order of 40 mm. The connecting sleeve is configured to expand by at least 30%, and is obtained on a braiding machine whose each spindle comprises two electrically conductive yarns and two electrically non-conductive yarns. The number of crossings per inch is preferably in the order of 11.

The electrically conductive yarns are multifilament yarns, each yarn comprising 8, or 10, or 16 filaments. Each filament has a diameter of about 0.10 mm. Each filament is made of tinned copper, especially with a tin or nickel coating. The electrically non-conductive yarns are preferably multifilament yarns made of polyethylene terephthalate, each in the order of 550 dtex.

In operation for an application in which the length of the cables 20, 21 to be protected is in the order of 80 cm, their combined outer diameters are in the order of 30 mm, and the length of the connector to be protected is of 20 cm with an outer diameter or perimeter in the order of 40 mm, the shielding device 40 comprises a protective sleeve 50 having a length of 80 cm and a diameter D1 of 30 mm, and a connecting sleeve 60 having a diameter D2 in the order of 40 mm, and a length of 20 cm. The mass of this device is of 216.6 g (namely 149.3 g for the protective sleeve 50 and 67.6 g for the connecting sleeve 60).

By way of comparison, a shielding device of the state of the art comprises a single sleeve of 40 mm in diameter having a length of 100 cm, which represents a mass of 336.5 g. In this specific example, the shielding device 40 according to the invention therefore has advantageously a mass 36% smaller than the mass of the comparative shielding device.

Figure 8:
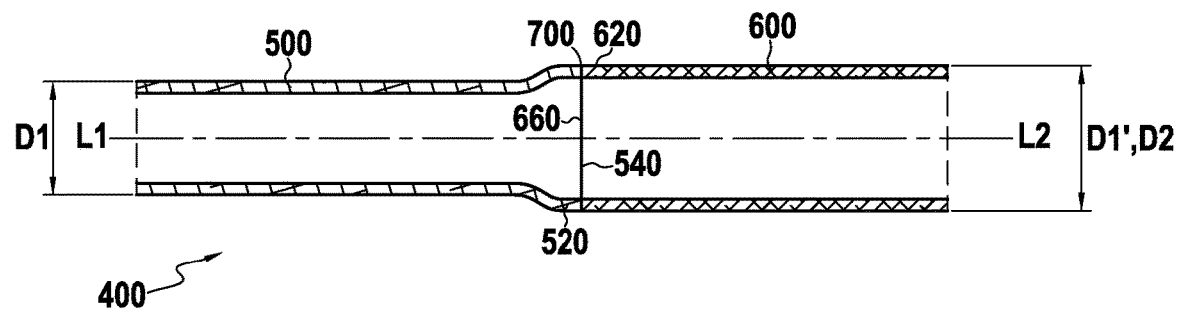
FIG. 8 illustrates a second example of a shielding device according to the invention.

FIG. 8 represents a second example of a shielding device 400 according to the invention in which the front part 520 of the protective sleeve 500 comprises a front annular edge 540 and the rear part 620 of the connecting sleeve 600 comprises a rear annular edge 660. The front annular edge 540 of the protective sleeve 520 and the rear annular edge 660 of the connecting sleeve 600 are disposed edge-to-edge in the first electrically conductive securing area 700 without superposition of the protective sleeve 500 by the connecting sleeve 600.

Figure 9:
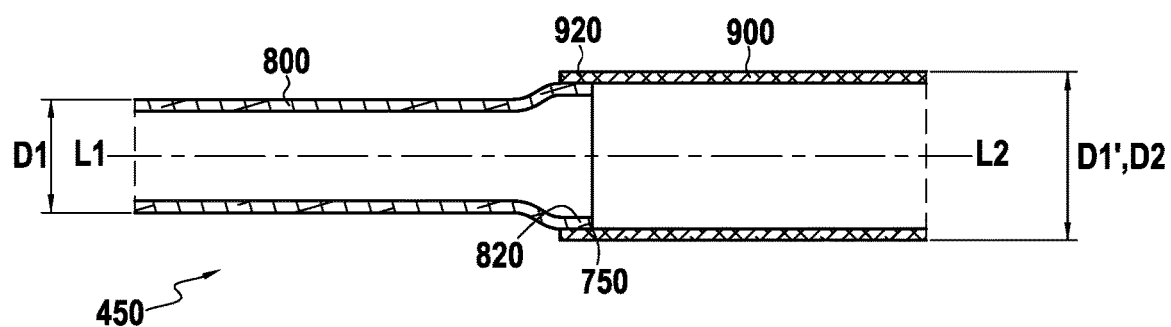
FIG. 9 illustrates a third example of a shielding device according to the invention.

FIG. 9 represents a third example of a shielding device 450 according to the invention in which the front part 820 of the protective sleeve 800 is superimposed with the rear part 920 of the connecting sleeve 900 in the first electrically conductive securing area 750, the front part 820 is disposed against the inner face of the rear part 920 of the connecting sleeve 900.

Figure 10:
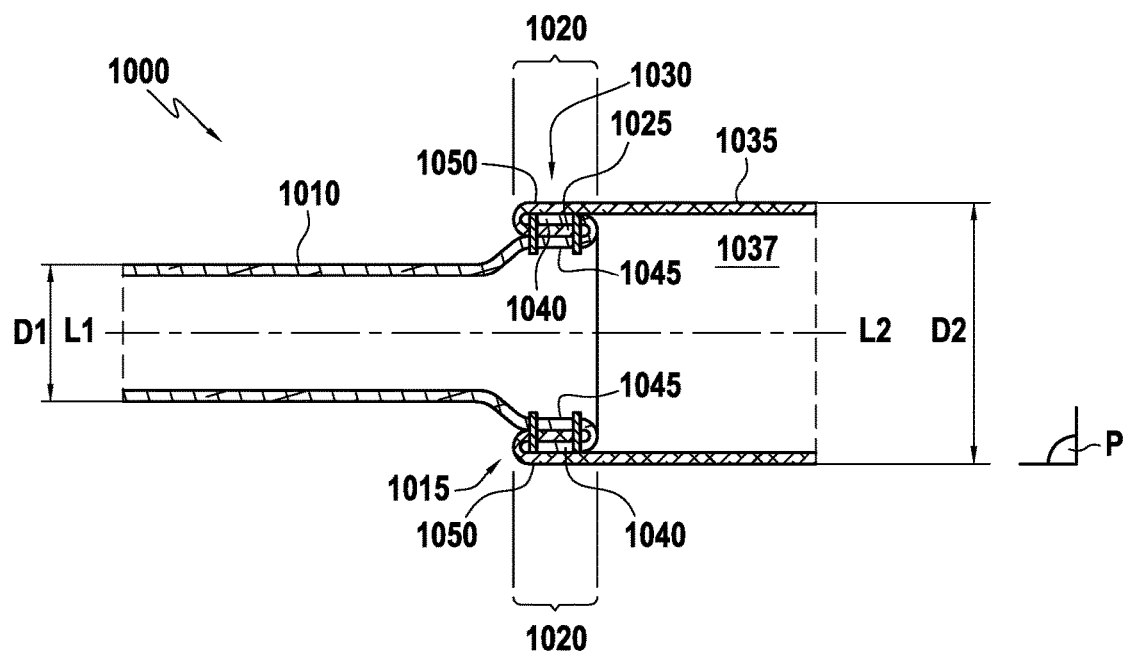
FIG. 10 illustrates a fourth example of a shielding device according to the invention.

FIG. 10 represents a fourth example of a shielding device 1000 according to the invention in which the front part 1015 of the protective textile sleeve 1010 is folded on itself towards the outside. The folded front part 1015 has a substantially U-shape along a longitudinal-section plane P passing through the longitudinal axis L1 of the protective sleeve 1010 having a diameter D1. The front part 1015 of the protective sleeve 1010 is folded around the inner portion 1025 of the rear part 1030 of the connecting sleeve 1035. The rear part 1030 of the connecting sleeve 1035 is also folded on itself, in particular towards the inside of its interior volume 1037 around the outer portion 1040 of the front part 1015 of the protective sleeve 1010. The front part 1015 of the protective sleeve 1010 thus comprises superimposed inner 1045 and outer 1040 portions. The rear part 1030 of the connecting sleeve 1035 comprises inner 1025 and outer 1050 portions which are also superimposed. The inner 1045 and outer 1040 portions of the front part 1015 of the protective sleeve 1010, substantially annular in shape, are secured in an electrically conductive manner at least partially with the inner portion 1025, of substantially annular shape, of the rear part 1030 of the connecting sleeve 1035, especially by ultrasound.

This variant makes it possible to combine a mechanically resistant welding, and improves the protection, especially against abrasion, of the elongate elements disposed in the interior volume of the protective sleeve, and possibly in the interior volume of the connecting sleeve. Indeed, the front part of the protective sleeve offers an end opening into its rounded interior volume. This same effect is obtained for the surrounding elements disposed outside the shielding device 1000 and coming into contact with the rounded surface of the rear part of the folded connecting sleeve 1035. The first electrically conductive securing area 1020 thus comprises three textile layers: the thicknesses or layers derived from the inner 1045 and outer 1040 portions of the protective sleeve 1010 and the inner portion 1025 of the connecting sleeve 1035 superimposed and secured together in their thicknesses using a bonding means derived from the sleeves themselves, for example by welding or ultrasound. The first securing area 1020 is covered by a portion, especially the outer portion 1050, of the connecting sleeve 1035.

Alternatively, the first securing area can comprise four textile layers secured to each other in their thicknesses: the inner 1045 and outer 1040 portions of the protective sleeve 1010, and the inner 1025 and outer 1050 portions of the connecting sleeve 1035, are secured to each other, for example by ultrasonic welding. In this case, the manufacturing method does not comprise the turning over of the body of the connecting sleeve. The rear part of the connecting sleeve and the front part of the protective sleeve are superimposed according to their final arrangements in the shielding device, then secured in an electrically conductive manner.

Figure 11:
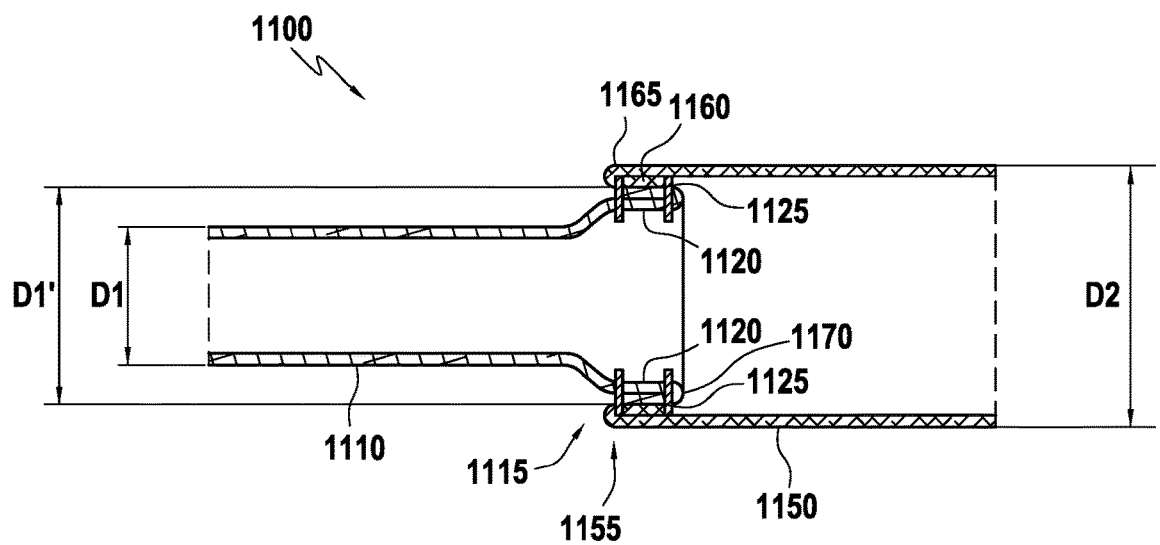
FIG. 11 illustrates a fifth example of a shielding device according to the invention.

FIG. 11 represents a fifth variant of embodiment of a shielding device 1100 according to the invention comprising protective sleeves 1110 of diameter D1 and connecting sleeves 1150 of diameter D2. The front part 1115 of the protective sleeve 1110 is folded on itself towards the outside of the protective sleeve 1110, and comprises superimposed inner 1120 and outer 1125 portions. The rear part 1155 of the connecting sleeve 1150 is also folded on itself, in its interior volume, and comprises superimposed inner 1160 and outer 1165 portions. The front part 1115 of the folded protective sleeve 1110 is superimposed on the rear part 1155 of the folded connecting sleeve 1150. In this specific example, the inner portion 1160 of the connecting sleeve 1150 and the outer portion 1125 of the protective sleeve 1110 are disposed between the outer portion 1165 of the connecting sleeve and the inner portion 1120 of the protective sleeve. The inner portions 1160 and 1120 and the outer portion 1125 are secured to each other using a bonding means, especially derived from the sleeves themselves, for example by ultrasonic welding, and thus form a first electrically conductive securing area 1170 comprising three textile layers. The first electrically conductive area 1170 is covered by a portion, in particular the outer portion 1165, of the connecting sleeve 1150, in particular not secured to the first conductive securing area 1170. The first electrically conductive securing area 1170 may alternatively comprise four superimposed textile layers secured to each other in an electrically conductive manner, by welding the outer portion 1165 with the portions 1160, 1125 and 1120. In this case, the manufacturing method does not comprise the turning over of the body of the connecting sleeve. The rear part of the connecting sleeve and the front part of the protective sleeve are superimposed according to their final arrangements in the shielding device then secured in an electrically conductive manner.

Method for Manufacturing the Shielding Device

Figure 3:
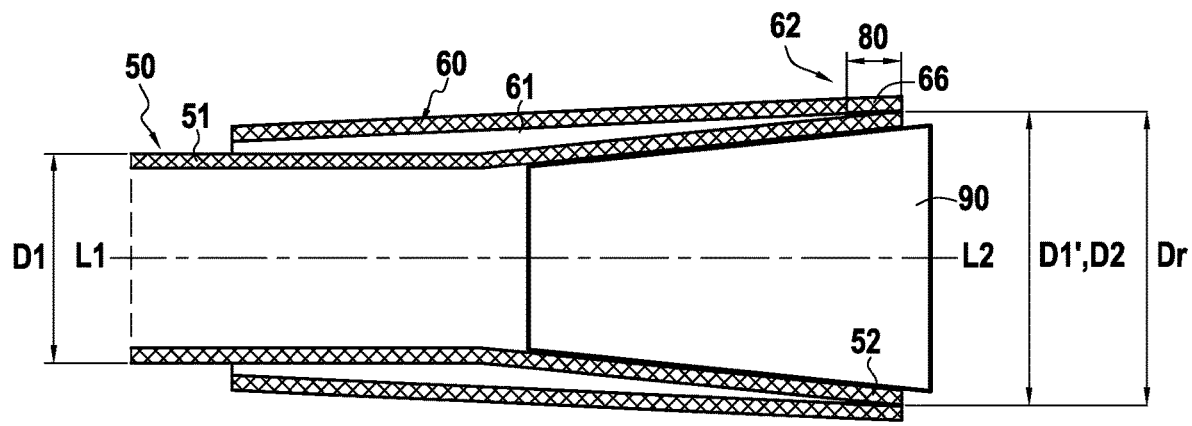
FIG. 3 represents a first step of a preferred example of the method for manufacturing the shielding device represented in FIG. 2.
Figure 4:
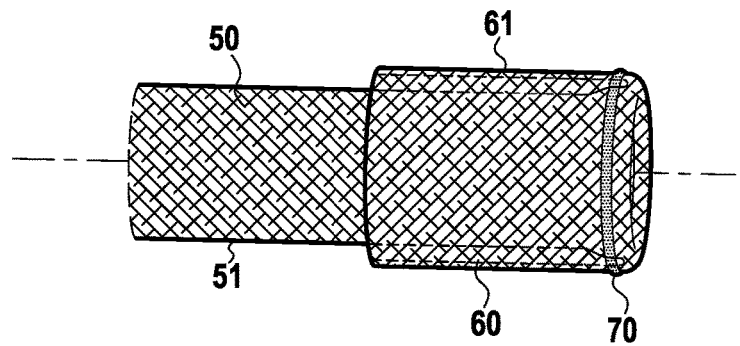
FIG. 4 represents a first example of a shielding device obtained after the first step of the manufacturing method represented schematically in FIG. 3.
Figure 5:
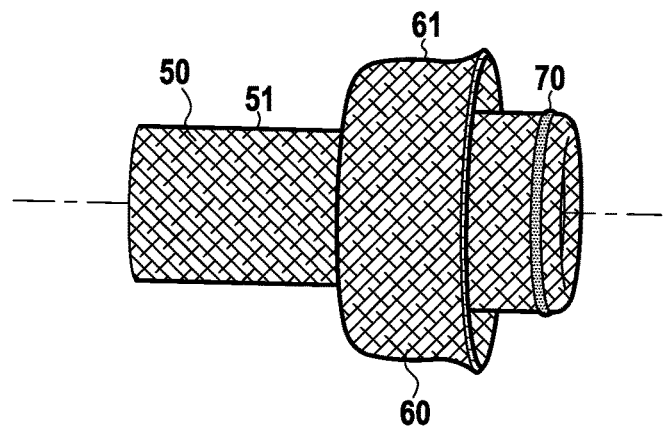
FIG. 5 represents a step of the method for manufacturing the shielding device represented in FIG. 2.

The shielding device 40 is preferably manufactured according to a manufacturing method described hereinafter with reference to FIGS. 3 to 6. The method firstly comprises a step of disposing the hollow protective textile sleeve 50 on at least one region 80 of a shape 90, said region 80 having an outer perimeter corresponds to the outer diameter Dr greater than or equal to D2, causing the expansion at least of the substantially annular front part 52 according to a diameter D1' substantially equal to D2. The protective sleeve 50 comprises a protective textile body 51 projecting from its annular front part 52, and the connecting sleeve 60 comprises a connecting textile body 61 projecting from its annular rear part 62, said protective and connecting textile bodies (51, 61) being substantially superimposed as represented in FIGS. 3 and 4. Then, the method comprises a step of bonding the hollow connecting textile sleeve 60 with the front part 52 of the connecting sleeve 50. Especially, the rear part 62 of the connecting sleeve 60 is superimposed on the front part 52 so that the front part 52 is disposed between said at least one region 80 of the shape 90 and the rear part 62 of the connecting sleeve 62. The method then comprises a step of forming the first electrically conductive, in particular at least partially annular, securing area 70 in which the rear part 62 of the connecting sleeve 60 and the front part 52 of the protective sleeve 50 are at least partly secured. The first electrically conductive securing area 70 is preferably formed using at least one bonding means selected from the list consisting of: an ultrasonic welding, an electron beam welding, a friction welding, a welding by brazing, a stitching with at least one electrically conductive yarn, or a combination thereof, preferably using an ultrasonic welding. This type of bonding makes it possible to form a securing area that is resistant to tearing but also perfectly electrically conductive so that the shielding effect is constant all along the shielding device 40. The method finally comprises a step of turning over the body 61 of the connecting sleeve 60, as represented in FIG. 5, so that the connecting sleeve 60 and the protective sleeve 50 are superimposed, in particular only in the first electrically conductive securing area 70.

In operation, the body 51 of the protective sleeve 50 has a diameter adapted to the electric cables 20, 21 it comprises in its interior volume without the body expanding, thereby preserving its properties of shielding and protection from the external mechanical attacks. The connecting sleeve 60 is secured to the protective sleeve 50 via a first securing area conducting the electricity 70. The annular front part 67 of the connecting sleeve 60 can also expand according to a diameter or a perimeter D2' in order to perfectly cover at least partly the grounding area 15. Preferably, the front part 67 is maintained in contact with the grounding area 15 by means of a clamping collar or an adhesive surrounding the connector and the front part 67.

The shielding device 40 according to the invention therefore has a size differentiated over its length adapted, on the one hand, to the electric cables and, on the other hand, to the connector, which makes it possible to optimize its mass. In addition, in operation, the body 61 is not deformed and therefore preserves its shielding properties. The shielding device 40 thus has a better holding on the cables to be protected, which do not move in the protective sleeve since the latter is adjusted. Moreover, since the protective sleeve is less cumbersome than the connecting sleeve, the shielding device has a reduced volume and is therefore less cumbersome. This arrangement is particularly advantageous when the shielding device equips for example electric or hybrid cars for reducing the space requirement of the engine space, thus freeing up volume for other needs.

Figure 12:
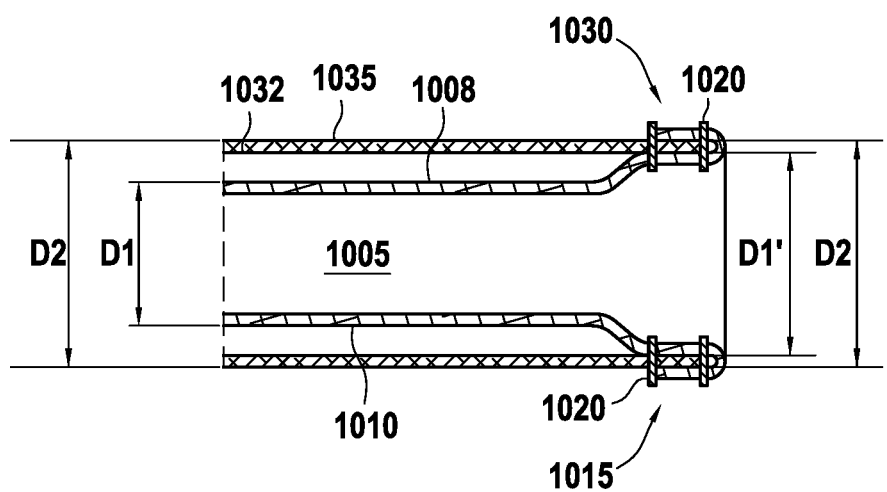
FIG. 12 illustrates a step of the manufacturing method of the fourth exemplary shielding device represented in FIG. 10.

A step of the method for manufacturing the shielding device 1000 is represented in FIG. 12.

(i) disposes firstly a hollow protective textile sleeve 1010 having an outer rest diameter D1 and an interior volume 1005 configured to receive one or several elongates element(s), and comprising a substantially annular front part 1015 having an open front end, on at least one expansion device (not represented), causing the expansion of at least the substantially annular front part 1015 of the protective sleeve 1010 along an outer perimeter D1' substantially equal to D2. (ii) provides a hollow connecting textile sleeve 1035 having a main rest diameter D2, D2 being greater than D1, and a substantially annular rear part 1030 having a rear open end. The rear part 1030 of the connecting sleeve 1035 is brought into contact with the front part 1015 of the protective sleeve 1010 so that the front part 1015 of the protective sleeve 1010 is folded towards the outside and around the inner portion 1025 of the rear part 1030 of the connecting sleeve 1035. Then, (iii) forms the first electrically conductive, in particular at least partially annular, securing area 1020 in which the rear part 1030 of the connecting sleeve 1035 and the front part 1015 of the protective sleeve 1010 are at least partly secured. The protective sleeve 1010 comprises a protective textile body 1008 projecting from its annular front part 1015, and the connecting sleeve 1035 comprises a connecting textile body 1032 projecting from its annular rear part 1030 as represented in FIG. 12. During step ii), the rear part 1032 of the connecting sleeve 1035 is at least partially superimposed on the front part 1015 of the protective sleeve 1010 on at least the expansion device, the front part 1015 of the protective sleeve 1010 being disposed between said at least expansion device, and the rear part 1030 of the connecting sleeve 1035. The protective sleeve 1010 comprises a protective textile body 1008 projecting from its annular front part 1015, and the connecting sleeve 1035 comprises a textile connection body 1032 projecting from its annular rear part 1035. During step iii), said protective 1008 and connecting 1032 textile bodies are at least partly superimposed. The method then comprises the turning over (iv) of the body 1032 of the connecting sleeve 1035 so that the connecting sleeve 1035 and the protective sleeve 1010 are superimposed, especially only, according to the rear part 1030 of the connecting sleeve 1030 and the front part 1015 of the protective sleeve 1010.

It should be noted that for the manufacture of the device 1100 represented in FIG. 11, the method described above is similar with the only difference that when the sleeves 1110 and 1150 are brought into contact, the front part 1115 folded towards the outside is at least partially superimposed with the unfolded rear part of the connecting sleeve, especially superimposed with the inner portion of the rear part of the connecting sleeve.

The invention claimed is:

1. An electromagnetic shielding device comprising:
   a. At least one hollow protective textile sleeve having a main rest diameter D1 and an interior volume configured to receive one or several elongated element(s),
   b. At least one hollow connecting textile sleeve having a rest diameter D2, D2 greater than D1,
   wherein the protective textile sleeve comprises a substantially annular front part having a front open end, the connecting textile sleeve comprises a substantially annular rear part having a rear open end, and the shielding device comprises a first electrically conductive, securing area in which the rear part of the connecting sleeve and the front part of the protective sleeve are at least partly secured;
   wherein at least one of (i) or (ii):
   (i) the rear part of the connecting sleeve is folded on itself and has a substantially U-shape along a longitudinal-section plane P passing through the longitudinal axis L2 of the connecting sleeve;
   (ii) wherein the front part of the protective sleeve is folded on itself and has a substantially U-shape along a plane P of longitudinal section passing through the longitudinal axis L1 of the protective sleeve.

2. The shielding device according to claim 1, wherein the connecting sleeve comprises a front part having a substantially annular front open end of a rest diameter D2, said front part being configured to expand radially in order to adopt a diameter D2' in the expanded state greater than or equal to 1.20 times the diameter D2.

3. The shielding device according to claim 1, wherein the front part of the protective sleeve is in an expanded state and with a diameter D1' approximately equal to the diameter D2 of the connecting sleeve.

4. The shielding device according to claim 1, wherein the rear part of the connecting sleeve comprises an inner portion at least partly secured to the protective sleeve and an outer portion, superimposed on the inner portion and in the extension of the inner portion.

5. The shielding device according to claim 1, wherein the front part of the protective sleeve comprises an outer portion at least partly secured to the connecting sleeve, and an inner portion covered at least partly by the outer portion of the front part of the protective sleeve and in the extension of the outer portion.

6. The shielding device according to claim 1, wherein the front part of the protective sleeve is folded on itself around, at least partially, a portion of the rear part of the connecting sleeve.

7. The shielding device according to claim 1, wherein folded front part of the protective sleeve is superimposed with the folded rear part of the connecting sleeve.

8. The shielding device according to claim 1, wherein the protective sleeve is in one several textile(s) selected among: a braid, a woven fabric, a knit, a non-woven fabric, or a combination thereof.

9. The shielding device according to claim 1, wherein the connecting sleeve is in one or several textile(s) selected among: a braid, a woven fabric, a knit, a non-woven fabric, or a combination thereof.

10. The shielding device according to claim 1, wherein the protective sleeve and/or the connecting sleeve is/are each a tubular braid or a tubular knit.

11. The shielding device according to claim 1, wherein the protective sleeve and/or the connecting sleeve comprises/comprise each at least one electrically conductive yarn and/or electrically conductive fibers.

12. The shielding device according to claim 1, wherein the protective sleeve and/or the connecting sleeve comprises/comprise each at least one electrically non-conductive yarn and/or electrically non-conductive fibers.

13. An electrically transmitting device comprising at least one connector having a grounding area, and one or several electrically conductive elongated element(s), especially each configured to transmit an electrical signal and/or an electrical power, comprising an electromagnetic shielding device according to claim 1.

14. The electrically transmitting device according to claim 13, wherein the front part of the connecting sleeve is secured at least partly to the grounding area.

15. A shielding device comprising,
   a. At least one hollow protective textile sleeve having a main rest diameter D1 and an interior volume configured to receive one or several elongated element(s),
   b. At least one hollow connecting textile sleeve having a rest diameter D2, D2 greater than D1,
   wherein the protective textile sleeve comprises a substantially annular front part having a front open end, the connecting textile sleeve comprises a substantially annular rear part having a rear open end, and the shielding device comprises a first electrically conductive, at least partially annular, securing area in which the rear part of the connecting sleeve and the front part of the protective sleeve are at least partly secured;

wherein first securing area comprises three or four textile layers secured in their thicknesses in an electrically conductive manner, including at least two textile layers of the protective textile sleeve, and at least one textile layer of the connecting sleeve.

16. An electrically transmitting device comprising at least one connector having a grounding area, and one or several electrically conductive elongated element(s), especially each configured to transmit an electrical signal and/or an electrical power, comprising an electromagnetic shielding device according to claim 15.

17. A method for manufacturing an electromagnetic shielding device comprising
   a. At least one hollow protective textile sleeve having a main rest diameter D1 and an interior volume configured to receive one or several elongated element(s),
   b. At least one hollow connecting textile sleeve having a rest diameter D2, D2 greater than D1,
   wherein the protective textile sleeve comprises a substantially annular front part having a front open end, the connecting textile sleeve comprises a substantially annular rear part having a rear open end, and the shielding device comprises a first electrically conductive, at least partially annular, securing area in which the rear part of the connecting sleeve and the front part of the protective sleeve are at least partly secured,
   wherein said method comprises:
   (i)—a step of disposing a hollow protective textile sleeve having an outer rest diameter D1 and an interior volume configured to receive one or several elongated member(s), and comprising a substantially annular front part having a front open end, on at least one expansion device, causing the expansion at least of the substantially annular front part of the protective sleeve according to an outer diameter D1' substantially equal to D2;
   (ii)—a step of providing a hollow connecting textile sleeve having a main rest diameter D2, D2 being greater than D1, and a substantially annular rear part having a rear open end, and a step of contacting the rear part of the connecting sleeve with the front part of the protective sleeve;
   (iii)—a step of forming a first electrically conductive securing area, in which the rear part of the connecting sleeve and the front part of the protective sleeve are at least partly secured; and
   (v) obtaining the shielding device; and
   wherein step (ii) comprises the superposition, or the juxtaposition, at least partial, of the front part of the protective sleeve with the rear part of the connecting sleeve.

18. The manufacturing method according to claim 17, wherein the protective sleeve comprises a protective textile body projecting from its annular front part, and the connecting sleeve comprises a connecting textile body projecting from its annular rear part, in that during step ii) the rear part of the connecting sleeve is superimposed at least partially on the front part of the protective sleeve on at least the expansion device, the front part of the protective sleeve being disposed between at least said expansion device, and the rear part of the connecting sleeve, in that during step iii), said protective and connecting textile bodies are at least partly superimposed, and in that the method comprises a step iv), prior to step v), comprising the turning over of the body of the connecting sleeve.

* * * * *